United States Patent [19]

Kudo

[11] 4,443,728

[45] Apr. 17, 1984

[54] GT-CUT QUARTZ RESONATOR

[76] Inventor: Akihito Kudo, 31-1; Kameido 6-chome, Koto-ku, Tokyo, Japan

[21] Appl. No.: 323,491

[22] Filed: Nov. 20, 1981

[30] Foreign Application Priority Data

May 29, 1981 [JP] Japan .................................. 56-82133

[51] Int. Cl.³ .......................................... H01L 41/08
[52] U.S. Cl. ................................... 310/312; 310/348; 310/361; 310/368
[58] Field of Search ................ 310/312, 348, 351–353, 310/360, 361, 367–368

[56] References Cited

U.S. PATENT DOCUMENTS

| 2,824,219 | 2/1958 | Fisher et al. ..................... 310/353 X |
| 3,969,640 | 7/1976 | Staudtz ............................... 310/312 |
| 4,112,324 | 9/1978 | Yamaguchi et al. ................ 310/353 |
| 4,350,918 | 9/1982 | Sato ............................... 310/361 X |

Primary Examiner—Peter S. Wong
Attorney, Agent, or Firm—Robert E. Burns; Emmanuel J. Lobato; Bruce L. Adams

[57] ABSTRACT

A GT-cut quartz resonator mounted on a pedestal is disclosed. The pedestal has a plural though holes on a predetermined positions. The frequency and the frequency-temperature characteristics of the GT-cut quartz resonator are easily adjusted by depositing masses on the resonator by evaporation and sputtering through the through holes on the pedestal.

22 Claims, 8 Drawing Figures

GT-CUT QUARTZ RESONATOR

BACKGROUND OF THE INVENTION

The present invention relates generally to a quartz resonator supported by a pedestal and, more particularly, to the shape of the pedestal.

Recently the precision of wristwatches has advanced significantly and the precision display thereof has improved from the yearly rate to the monthly rate. To manufacture wristwatches having high precision, a composite resonator which incorporates two tuning fork type quartz resonators has been developed and in which temperature variation is theoretically compensated by utilizing the difference in peak temperatures of the frequency-temperature characteristics caused by the difference in cut angles of the two resonators. Keeping pace with the demand for such high precision, the demand for miniaturization and reduction of the thickness of the wristwatches have also benn areas which have received much attention. In view of the above requirements, it is disadvantageous to incorporate two resonators in a wristwatch. One approach to overcome this disadvantage has been the development of the AT-cut quartz resonators which attain the high precision by using a single resonator. This type, however, is disadvantageous because of its large current consumption at high frequency, its short battery life, large shape and inability to enable to reduction of the thickness of the watches.

Accordingly, the GT-cut quartz resonator having excellent frequency-temperature characteristics by using a single resonator, and which is of miniature size and capable of high productivity because it is formed by a photo-etching process, is presently drawing the much attention. Using this resonator, a quartz resonator of miniature size, of small crystal impedance (CI value) and of excellent frequency-temperature characteristics is realized by a suitable combination of the cut angle, shape and electrode arrangement. The GT-cut quartz resonator is particularly excellent with respect to the frequency-temperature characteristics, i.e., several PPM within the temperature range of $-80°$ C. to $120°$ C. Since the frequency-temperature characteristics of the resonator are decided by the dimensional ratio of the relatively long side to the short side of the resonator, the frequency-temperature characteristics are dispersed by the dispersion of the quality of the resonator due to the limitation of the accuracy of finishing. Therefore it is necessary to adjust the frequency by depositing masses on the short sides and long sides, or eliminating the masses previously deposited on the short sides and long sides by means of a laser. (The present invention particularly illustrates the method of depositing the masses by way of example.) Hereinafter several problems attended with the frequency adjustment will be illustrated in conjunction with the drawings.

FIG. 1 shows a GT-cut quartz resonator R comprising a vibrating portion 1, bridge portions 2, vibration attenuating portions 3 which prevent the transmission of the vibration to supporting portions 4, the portions 1 to 4 comprising a one piece unitary structure. The oblique lined portion indicates an exciting electrode. The frequency-temperature characteristics of the resonator are obtained by coupling two vibrational modes in a single coupling resonator. Namely, the frequency-temperature characteristics are decided by the difference in frequency of the two modes. Particularly, the frequency-temperature characteristics of the GT-cut quartz resonator are decided by the difference between the relatively short side dimension and relatively long side dimension. The higher frequency is decided by the short side dimension H which is represented by $f_H$ and the lower frequency is decided by the long side dimension L which is represented by $f_L$. The frequency-temperature characteristics of the GT-cut quartz resonator are decided by $f_H - f_L = \Delta f$.

FIG. 2 shows an example in which the GT-cut quartz resonator R shown in FIG. 1 is mounted on a pedestal 5 to adjust the value $\Delta f$. In the figure, an evaporation source E is located as if the evaporation material is evaporated from the upper direction for conveniece. Actually, however, the evaporation source E is located below the resonator and the evaporation material is evaporated from the lower direction in most cases.

In case $f_H$ is adjusted, the masses evaporated from the evaporation source E are controlled to conform to the shape of a through hole provided on a mask M and deposited at the position $A_1'$ or $A_2'$ (positioned almost at the center of the long sides). This time $\Delta f$ becomes smaller since $f_1$ little changes. As $f_H$ becomes the oscillation frequency (or basic frequency) when connected to the oscillating circuit, $f_H$ is necessary to be the exponents of 2, for example. For this $f_H$ is ordinary the exponents of 2. While any frequency is possible according to the shapes of the GT-cut quartz resonator, 1 to 2 $MH_z$ band is optimum for watches. Therefore, in the case 1 $MH_z$ band is used, the frequency is 1.048576 $MH_z$, and in the case 2 $MH_z$ band is used, the frequency is 2.097152 $MH_z$, and both of which are the exponents of 2. When the frequency-temperature characteristics are set at the optimum value only by adjusting $f_H$ to the reference frequency, the frequency adjustment is over. Since the frequency-temperature characteristics or $\Delta f$, however, are not always optimum, $\Delta f$ is set more finely by adjusting $f_L$. The mask M is held in place to deposit the masses $B_1'$ and $B_2'$ (positioned almost at the center of the short sides). Actually, however, the resonator shifts to the mask position provided with the holes $B_1'$ and $B_2'$. Then the masses evaporated from the evaporation source E are deposited from the evaporation source E. The frequency-temperature characteristics are thus adjusted by adjusting $f_H$ and $f_L$ to the respective reference frequencies and setting $\Delta f$ at the optimum value. The figure also shows the GT-cut quartz resonator mounted on the pedestal connected to a lead terminal 7 for extracting the signal by an adhesive member such as a solder 6 or the like. The pedestal is provided to support both sides of the supporting portions 4 of the resonator to ensure the shock resistance since the bridge portions 2 are very thin to attenuate the vibration sufficiently at the vibration attenuating portions, as already illustrated in the explanation of the GT-cut quartz resonator in FIG. 1.

FIG. 3 shows an embodiment of the method of a adjusting the evaporation frequency used generally for mass production. The figure shows the conventional evaporating method in which the evaporation source is located beneath the resonator in contrast with FIG. 2. In FIG. 3, a resonator R is mounted on the pedestal 5. The resonator provided with the pedestal is connected to the lead terminal 7 provided with a plug, and connected to an oscillating circuit provided within the device to be oscillated, whereby the frequency is adjusted by measuring the frequency. A plug portion 8 comprising the resonator is pressed by a spring biased pressing rod 9 to position or fix the resonator to the device. Then a voltage is applied to the evaporation source E to evaporate the masses, whereby the masses are deposited on respective positions on the resonator by way of the through hole provided on the mask M. In this method, the evaporation source is fixed and the resonator R and the mask M are rotated as a unit, whereby only the resonator R whose frequency is to be adjusted and the mask M are positioned directly above the evaporation source.

FIG. 4 shows a plan view of FIG. 3 viewed from the X direction. The resonator R is not shown in the figure since it is mounted on the other side of the pedestal. Assuming that a resonator mounted on the pedestal is improperly aligned and is set inclined at some angle (a resonator 5B is shown by way of example), the positions to deposit the masses are shifted from the hole position of the mask M, whereby the masses can not be deposited on the desired positions on the short sides and the long sides. In actual practice such a problem often occurs. On the other hand, since the masses are deposited by oscillating the resonator, it is necessary to provide a space between the mask and the resonator to some extent, whereby the masses are deposited in a larger pattern than the actual hole shape of the mask. Moreover, the mask hole becomes smaller and gradually filled with the material as the evaporation masses are deposited therethrough repeatedly. In this way the positioning is difficult and takes a long time in the conventional frequency adjusting method by evaporation, since the resonator is held in place taking account of the mask hole. Further the shape of the masses deposited on the resonator is larger than the mask pattern due to the space existing between the resonator and the mask. Further it is necessary to periodically replace the mask when the mask hole becomes smaller.

BRIEF SUMMARY OF INVENTION

The present invention aims to eliminate the above noted drawbacks and therefore, it is an object of the present invention to provide a GT-cut quartz resonator mounted on a pedestal having through holes.

Other features and advantages of the invention will be apparent from the following description taken in connection with the accompanying drawings.

BRIEF EXPLANATION OF THE DRAWINGGS

FIG. 1 shows a plan view of the conventional GT-cut resonator,

FIG. 2 shows a perspective view of an example of the conventional GT-cut resonator mounted on a pedestal, FIG. 3 shows a front view of one embodiment for mass producing the conventional GT-cut resonator, FIG. 4 shows a plan view of FIG. 3, FIG. 5 shows a perspective view of an embodiment of the quartz resonator constructed according to the present invention, FIGS. 6(a) and 6(b) show perspective views of applying the masses to the resonator according the present invention, and FIG. 7 show a perspective view showing another embodiment of the present invention.

DETAILED DESCRIPTION OF THE INVENTION

Figure 1:
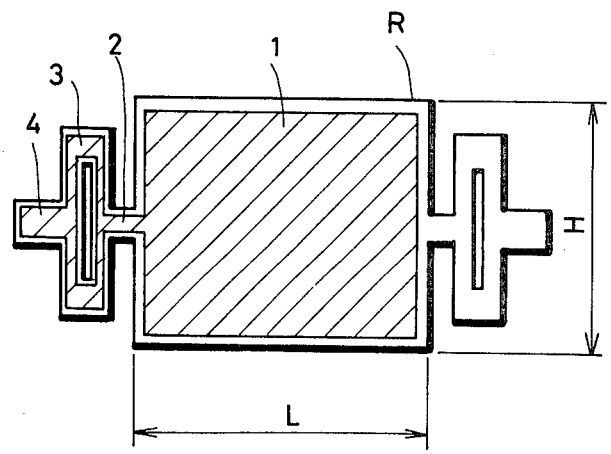
Figure 2:
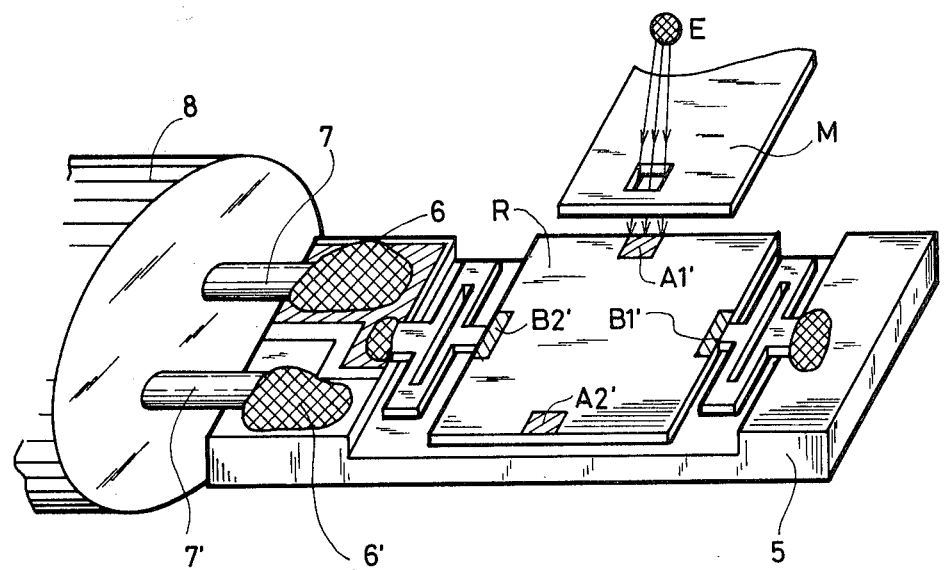
Figure 3:
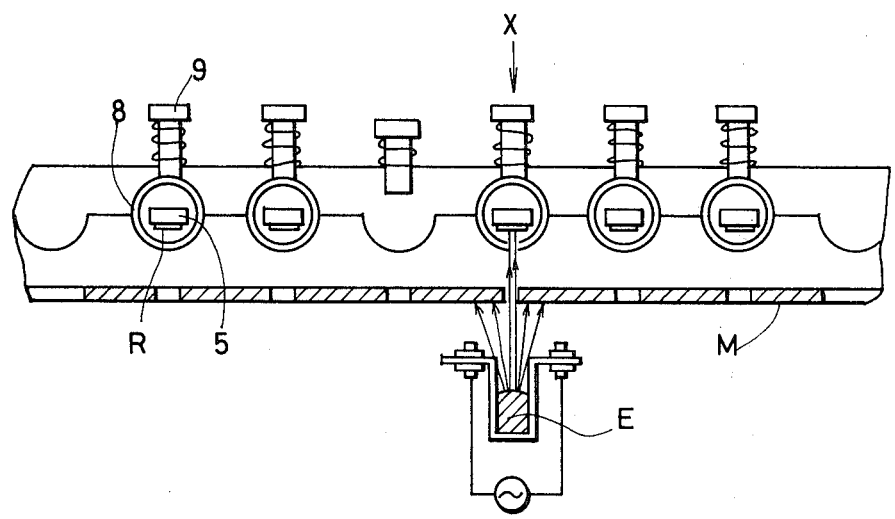
Figure 4:
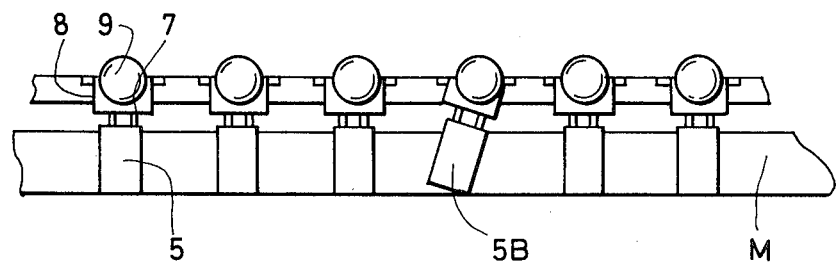
Figure 5:
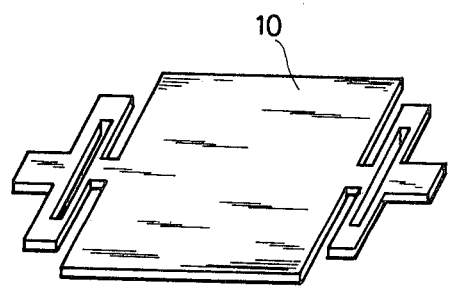
Figure 5:
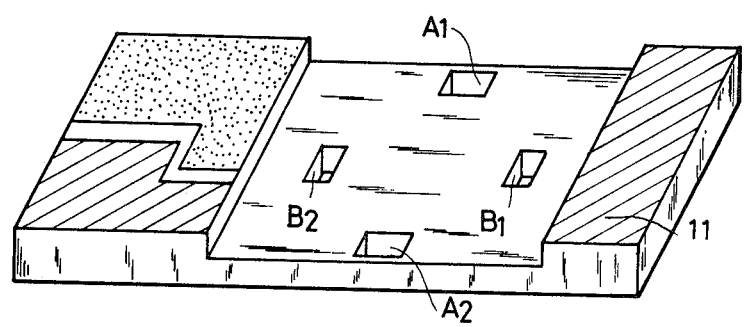

Referring first to FIG. 5, there is shown the first embodiment of the present invention showing a quartz coupling resonator mounted on a pedestal having a plurality of through holes. A resonator 10 is mounted on a pedestal 11 provided with plural sets of through holes A1, A2 and B1, B2 according to the present invention. The pedestal 11 has a hollowed-out concave shape defining a recessed portion, and the vibrating portion, the vibration attenuating portions and the bridge portions of the resonator 10 are mounted over the recessed portion of the pedestal. The through holes of the pedestal in spaced-apart facing relationship relative thereto are positioned almost near the center of the long sides and the short sides of the resonator mounted on the concave portion.

The through holes may be provided at the corners of the vibrating portion or at intermediate positions between the corners of the vibrating portion and the center of the long sides and the short sides by way of another embodiment. In such case, however, it is difficult to change the frequency of the long sides and the short sides indepedently since the masses deposited to change the frequency of the long sides also causes a considerable change in the frequency of the short sides, whereby $\Delta f$ is also hard adjust.

A description will now be given of the frequency adjusting method of the GT-cut resonator using the pedestal provided with the through holes. The resonator mounted on the pedestal is set in the evaporation device illustrated in the conventional embodiment. The shape of the masses deposited on the vibrator is controlled by the through holes provided on the pedestal according to the present invention, whereby the conventional holed mask is not needed. Moreover, it is not necessary to hold the resonator in place with respect to the position of the mask hole as is necessary in the conventional method.

Figure 6A:
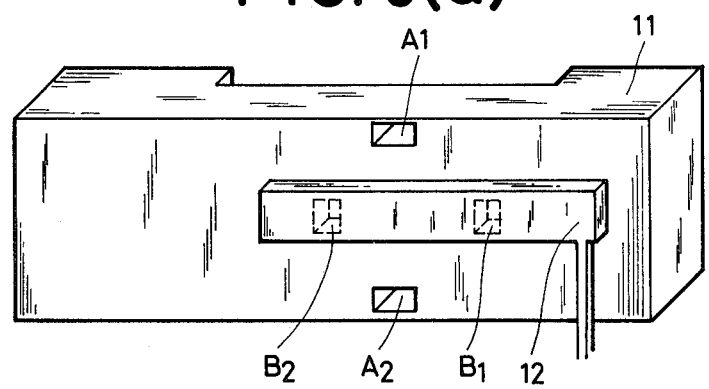

Now a description will be given as to the manner of adjustment of the $\Delta f$ of the resonator. FIG. 6(a) shows an embodiment in which $f_H$ is adjusted. (The pedestal is viewed from the rear side in FIG. 6, for explanation). The set of holes $B_1$ and $B_2$ are blocked or choked by a shutter member 12. The shutter member 12 functions as a shutter which opens and closes the evaporating portions, and is easily operable by being mounted on the evaporating device. The shutter member may be brought in contact with the pedestal so that the holes $B_1$ and $B_2$ are tightly choked when the shutter member 12 is in contact with the rear face of the pedestal. Accordingly, it is not necessary to provide the holed mask, or to shift the mask or the resonator. In this way $f_H$ is adjusted by choking the holes $B_1$ and $B_2$ and depositing the masses on the resonator through the exposed set of holes A1 and A2.

Figure 6B:
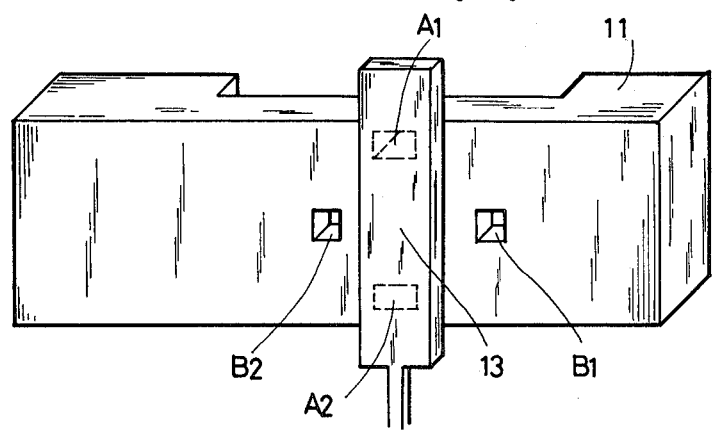

FIG. 6(b) shows an embodiment in which $f_L$ is adjusted. A shutter member 13 is positioned over the set of through holes $A_1$ and $A_2$ on the pedestal to choke them. When the masses are deposited through the exposed set of holes B1 and B2 under these circumstances, only $f_L$ is adjusted and thereby $\Delta f$ is adjusted.

According to the present invention, the holed mask is not required as in conventional technique and the frequency adjustment is simplified.

Further, it is necessary to leave the space between the vibrating portion and the concave portion on the pedestal to ensure that these two portions do not contact each other during use of the resonator. The space should be on the order of several tens microns lest the vibrating portion should make contact with the pedestal due to ordinary shocks. If the concave portion on the pedestal is 30 microns deep, the plate thickness of the pedestal can be made 100 microns by the half etching technique, whereby the non-uniformity of the thickness of the pedestal is extremely small. Since the position of the through holes on the pedestal is in close proximity to the vibrating portion, the evaporated masses are deposited essentially in the form of the holes on the pedestal. Further, since the pedestal and the vibrating portion are securely fixed by adhesives, the hole positions on the pedestal do not shift relative to the vibrating portion. Therefore the masses are deposited on the vibrating portion in the form of the through holes even if the positions of the holes are more or less shifted from the pedestal when set in the evaporating device. As a result, the resonator mounted on the pedestal can be easily set on the evaporation device as the precision is not so required.

While the hole size is gradually smaller as the same mask is repeatedly used in the conventional method, the pedestal according to the present invention is not used as a mask once the frequency adjustment is finished, and the pedestal is replaced by a new one in the case another resonator is to undergo frequency adjustment. Consequently the conventional drawbacks are eliminated.

Figure 7:
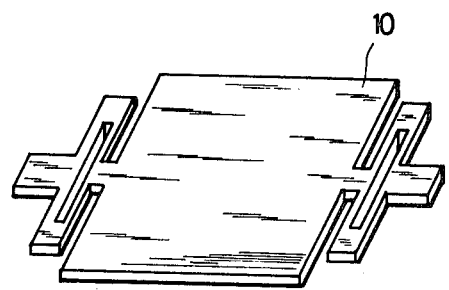
Figure 7:
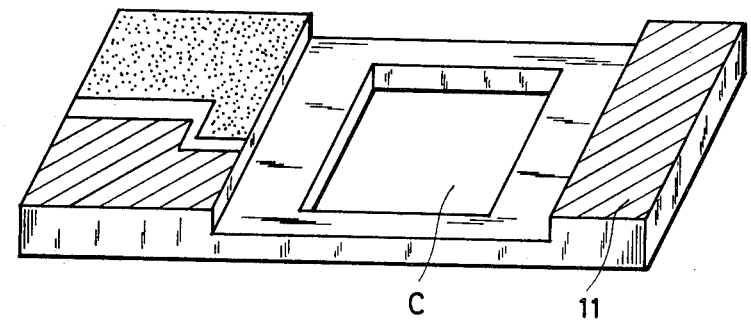

FIG. 7 is another embodiment of the present invention in which the pedestal is provided with a single through hole represented by C. The single through hole is utilized to add the thickness of the exciting electrode for frequency adjustment in case the frequency-temperature characteristics adjustment are almost finished and adjusted to the oscillation frequency (exponents of 2).

While I have shown and described certain present preferred embodiments of the invention it is to be distinctly understood that the invention is not limited thereto but may be applied to the resonators of other modes and especially applied easily to the AT-cut resonators and the GT-cut resonators.

What is claimed is:

1. A GT-cut quartz resonator unit comprising: a resonator including a vibrating portion having opposed relatively short sides and opposed relatively long sides, at least one supporting portion, and at least one bridge portion connecting said vibrating and supporting portions; and a pedestal connected to the resonator supporting portion to support said resonator, the pedestal having a region spaced from and facing the resonator vibrating portion, and the pedestal region having plural through holes therein facing edge portions of said vibrating portion.

2. A GT-cut quartz resonator unit as claimed in claim 1; including masses deposited on the edge portions of said vibrating portion through said through holes for adjusting the frequency-temperature characteristics of said resonator.

3. A GT-cut quartz resonator unit as claimed in claim 2; wherein said resonator comprises a single piece.

4. A GT-cut quartz resonator unit as claimed in claim 3; wherein said resonator comprises a photo-etched resonator.

5. A GT-cut quartz resonator unit as claimed in claim 2; wherein said resonator includes two supporting portions and two bridge portions.

6. A GT-cut quartz resonator unit as claimed in claim 5; wherein both end portions of said pedestal are thicker than the middle portion of said pedestal, and said supporting portions of the resonator are respectively mounted on each of said thicker end portions.

7. A GT-cut quartz resonator unit as claimed in claim 5; including electrodes of different polarity from each other respectively disposed on said two supporting portions of the resonator.

8. A GT-cut quartz resonator unit as claimed in claim 7; including electrodes of different polarity from each other disposed on one of said thicker end portions of the pedestal, and each of said electrodes being connected to respective ones of the electrodes disposed on the two supporting portions of the resonator.

9. A GT-cut quartz resonator unit as claimed in claim 1; wherein said resonator comprises a single piece.

10. A GT-cut quartz resonator unit as claimed in claim 9; wherein said resonator comprises a photo-etched resonator.

11. A GT-cut quartz resonator unit as claimed in claim 1; wherein said resonator includes two supporting portions and two bridge portions.

12. A GT-cut quartz resonator unit as claimed in claim 11; wherein both end portions of said pedestal are thicker than the middle portion of said pedestal, and said supporting portions of the resonator are respectively mounted on each of said thicker end portions.

13. A GT-cut quartz resonator unit as claimed in claim 11; including electrodes of different polarity from each other respectively disposed on said two supporting portions of the resonator.

14. A GT-cut quartz resonator unit as claimed in claim 13; including electrodes of different polarity from each other disposed on one of said thicker end portions of the pedestal, and each of said electrodes being connected to respective ones of the electrodes disposed on the two supporting portions of the resonator.

15. A coupling resonator unit comprising: a coupling resonator comprised of a single piece of piezoelectric material having opposed major surfaces and having at least two coupled together vibrational modes including a lower frequency mode and a higher frequency mode; a pedestal connected to and supporting the resonator, the pedestal having a region spaced from and facing one of the major surfaces of the resonator; and adjusting means for selectively effecting adjustment of the frequency-temperature characteristics of the resonator, the adjusting means including plural sets of holes extending completely through the pedestal region, a first set of the holes being positioned relative to the one major surface of the resonator to enable mass material to be deposited therethrough onto the resonator one major surface at a location effective to adjust the lower frequency-temperature characteristic, and a second set of the holes being positioned relative to the one major surface of the resonator to enable mass material to be deposited therethrough onto the resonator one major surface at a location effective to adjust the higher frequency-temperature characteristic.

16. A coupling resonator according to claim 15; wherein the first and second sets of holes are positioned so as to effect the deposition of the mass material at spaced locations on the marginal edge portions of the resonator one major surface.

17. A coupling resonator according to claim 15; wherein the resonator comprises a vibrating portion spaced from and facing the pedestal region and having opposed relatively short sides and opposed relatively long sides, at least one supporting portion connected to the pedestal, and at least one bridge portion interconnecting the vibrating and supporting portions.

18. A coupling resonator according to claim 17; wherein the first set of holes in the pedestal region comprise holes positioned at the marginal edge portions of the short sides of the vibrating portion, and the second set of holes in the pedestal region comprise holes positioned at the marginal edge portions of the long sides of the vibrating portion.

19. A coupling resonator according to claim 18; wherein the first set of holes comprises two holes each positioned approximately midway along the length of one of the short sides, and the second set of holes comprises two holes each positioned approximately midway along the length of one of the long sides.

20. A coupling resonator according to claim 17; wherein the resonator includes two supporting portions and two bridge portions.

21. A coupling resonator according to claim 20; wherein the pedestal has a recessed middle portion which comprises the pedestal region, the recessed middle portion being connected at opposite ends to respective end portions which are thicker than the recessed middle portion, the two supporting portions of the resonator being connected to respective ones of the end portions of the pedestal.

22. A coupling resonator according to claim 15; wherein the resonator comprises a GT-cut quartz resonator.

* * * * *